SILVER HALIDE SENSITIZED LITHOGRAPHIC PRINTING PLATE
Original Filed Dec. 21, 1959
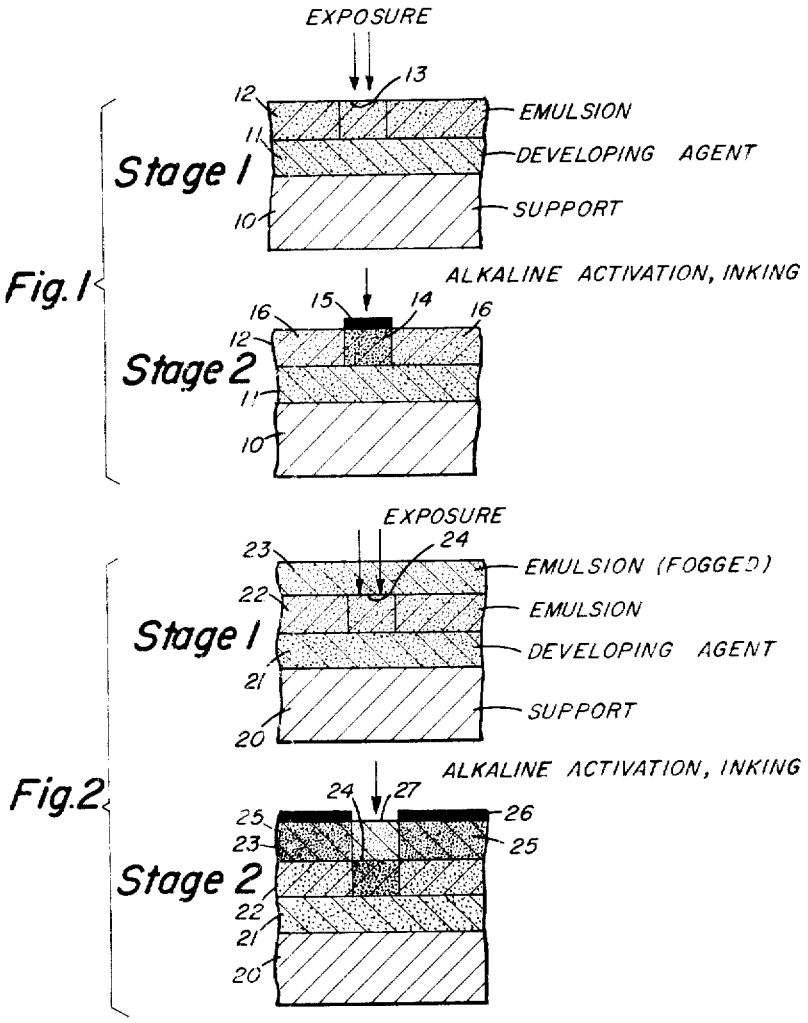
EDWARD C. YACKEL
THOMAS I. ABBOTT
INVENTORS
BY R. Frank Smith
Henry E. Byers
ATTORNEY & AGENT United States Patent Office Re. 25,885
Reissued Oct. 19, 1965

25,885

SILVER HALIDE SENSITIZED LITHOGRAPHIC PRINTING PLATE

Edward C. Yackel and Thomas I. Abbott, Rochester, N.Y., assignors to Eastman Kodak Company, Rochester, N.Y., a corporation of New Jersey Original No. 3,146,104, dated Aug. 25, 1964, Ser. No. 861,125, Dec. 21, 1959. Application for reissue Oct. 6, 1964, Ser. No. 414,937
38 Claims. (Cl. 96—33)

Matter enclosed in heavy brackets [ ] appears in the original patent but forms no part of this reissue specification; matter printed in italics indicates the additions made by reissue.

This invention relates to photographic elements and processes adapted to the production of lithographic printing plates.

Lithographic printing plates and the printing therefrom on a lithographic printing press involves the use of a plate, the printing surface of which is differentially ink-receptive when moistened with water. Usually the plate includes oleophilic characters or designs which are receptive of greasy printing ink and hydrophilic areas which repel ink when moistened with water. Thus, the printing of the plate does not depend upon the printing characters being either substantially above or below the hydrophilic nonprinting surface as opposed to other plates such as relief or intaglio printing plates.

A great many processes have been suggested for preparing lithographic printing plates. A well-known process involves forming an oleophilic design on a hydrophilic surface by photographic means, e.g. by differentially hardening a light-sensitive organic colloid layer on a lithographic surface with actinic rays and removing the unhardened areas to bare the hydrophilic nonprinting areas. In other processes a preformed design may be transferred from one support to another to provide the requisite differentially ink-receptive element. Also, an oleophilic design may be formed photographically or by other means of a hydrophobic surface and the design used as a resist to convert the uncovered hydrophobic areas to hydrophilic areas, for example, by hydrolysis as in the case of cellulose ester printing plates.

We have discovered a simple photographic method for preparing lithographic printing plates which involves formation of a developable silver halide image, as by means of exposure to a line or halftone subject, of a hydrophilic organic colloid-silver halide film such as gelatino-silver halide sensitized plate, followed by silver halide development. No additional steps, such as etching or washing off the unhardened areas, are required for producing the plates. Moreover, the process in its various forms can be adapted to the production of positive plates from either positive or negative subjects.

The processes of our invention thus include the formation of a developable silver halide image by exposure to a subject of a silver halide emulsion layer and contiguous silver halide developing agent (developing agent present in the emulsion or a layer effectively adjacent thereto) which when oxidized in the development reaction in the presence of the hydrophilic organic colloid vehicle present in the silver halide emulsion layer, forms an oleophilic image (ink-receptive image), followed by treatment of the exposed emulsion with alkaline solution which may contain a developing agent if it is not present in the sensitive element, to initiate development of the exposed silver halide and the formation thereby of the oleophilic image areas receptive of printing ink. Upon inking the moistened plate and printing on a lithographic printing press, the desired lithographic production, which will be negative to the original subject will be obtained. If, however, a positive-working plate is desired the photographic element described above may contain in addition, a fogged silver halide emulsion as the uppermost layer. This photographic element when exposed to a subject, and its contiguous silver halide developing agent is activated, the developing agent will react with the sensitive lower silver halide emulsion layer to form the negative image and the unused silver halide developing agent present in the unexposed areas of said sensitive lower silver halide emulsion layer will then migrate upward to the fogged surface silver halide emulsion layer, and when oxidized in the presence of the hydrophilic organic colloid present in this layer, will form an oleophilic image in the surface which is positive in respect to the original subject. A positive working plate also can be obtained by using a direct-positive emulsion such as those described in Kendall and Hill U.S. Patent 2,541,472 or Fallesen U.S. Patent 2,497,875. If desired, a positive working plate also can be obtained by processing the exposed plate first in a non-tanning developer such as one containing hydroquinone and sulfite, exposing the undeveloped silver halide by flashing a white light and then processing in an alkaline solution containing the developing agent which when oxidized in the development reaction in the presence of the hydrophilic organic colloid vehicle present in the silver halide emulsion layer forms an ink-receptive image. When employing our invention, illustrated the following examples, at least about 1000 lithographic prints of high quality are obtainable from each printing element.

There are a number of other ways of providing the silver halide image which is developed to form the oleophilic image as will be described below. For example, a silver halide complex image resulting from the transfer of silver halide in a silver halide diffusion transfer process can be developed from form the oleophilic image. Likewise, silver halide images arising from the rehalogenation of silver images can be developed with the developing agents described below to yield the oleophilic images. It has also been found possible to prepare a suitable planographic printing plate of the type described above by transferring the unused developing agent, after initial development of a silver halide image, to a receiving sheet comprising a hydrophilic organic colloid, e.g. gelatin, and which may also contain, as oxidizing agents, manganese dioxide or fogged silver halide on a suitable support. When the unused developer agent is transferred to receiving sheets of the type described above, it is oxidized in the presence of the hydrophilic organic colloid present and reacts to form the imagewise oleophilic areas used in forming the planographic printing plates of this invention. A further modification of the above procedure is to transfer the unused developing agent to a receiving sheet composed of a hydrophilic organic colloid layer on a suitable support. This layer is then "swabbed" with a solution of a suitable oxidizing agent, e.g. ferric chloride or ferric sulfate ethylene-diaminetetraacetic acid complex which oxidizes the unused developer agent present in the receiver sheet apparently causing it to react with the hydrophilic organic colloid layer and form the imagewise oleophilic areas useful in this invention. Accordingly, our invention results from the discovery that a photographic emulsion layer such as a gelatino-silver halide emulsion layer which is uniformly hydrophilic throughout its surface and thus not ink-receptive, can be developed so as to effect a useful differential ink-respectivity for lithographic printing purposes. While the processes of the invention may involve reaction of the oxidized developing agent with the emulsion colloid the process does not depend on the physical change of the colloid since not all silver halide developing agents nor even all tanning silver halide developing agents are effective in the process, only those capable of oxidation in the presence of the hydrophilic colloid vehicle of the emulsion layer to form and ink-receptive image are useful.

In one embodiment of the invention, a photographic emulsion is merely exposed to the subject in the presence of the developing agent, followed by treatment with alkaline solution, inking the resultant plate and printing. The developing agent can be incorporated in the photosensitive material or in the alkaline processing solution. If the photographic emulsion used is an ordinary developing-out emulsion, the plate obtained is a negative with regard to the subject, otherwise by use of direct positive emulsions, the plate obtained is a positive.

In another embodiment of the invention wherein a positive working plate is used, the same comprises an unexposed silver halide emulsion layer and contiguous developing agent of the type mentioned. Superposed on this emulsion is a fogged silver halide emulsion layer. After exposure, activation of the exposed plate with alkaline solution results in the formation of a negative image in the exposed regions of the negative emulsion layer, the residual silver halide developing agent migrates to and then develops the fogged emulsion in the positive regions thereby producing a positive oleophilic design at the surface of the sensitive element which takes printing ink and can be printed on a lithographic printing press. Direct positive emulsions can also be used in this embodiment of the invention if a negative working plate is desired. Other specific embodiments comprising our broad invention are described below.

In the above processes, the ink-receptive areas of the printing plates on a background of hydrophilic material are obtained by alkaline activation of a silver halide developing agent in the presence of a hydrophilic organic colloid silver halide emulsion layer. The result is to form a silver image and oxidized developing agent in the region of development. The organic colloid of the emulsion layer may undergo some additional hardening at the same time. However, the hardening of the hydrophilic organic colloid layer in the region of development is incidental to successful operation of the invention since some silver halide developing agents, such as catechol, hydroquinone and toluhydroquinone, which are known to be strong gelatin-tanning silver halide developing agents, are not useful in the sensitive elements presumably because the oxidation products formed in the presence of the hydrophilic organic colloid silver halide emulsion layer do not form oleophilic images, whereas other closely related silver halide developing agents such as chlorohydroquinone, are quite useful in the process of the invention. Also, the invention is operative with various hydrophilic organic colloid silver halide emulsions.

Accordingly, a prerequisite of the processes of our invention is that the silver halide developing agent used by one capable of oxidation in the presence of the hydrophilic organic colloid present in the silver halide emulsion layer to produce an image receptive to greasy printing ink. The polyhydroxybenzene developing agents substituted with halogen, monocyclic aryl groups of the benzene series and alkyl groups of at least 2 and preferably from 2 to 6 carbon atoms have this property. The 1,2-dihydroxybenzene developing agents substituted by halogen, monocyclic aryl of the benzene series and alkyl groups of at least 2 carbon atoms and preferably 2 to 6 carbon atoms are particularly useful in the process. Silver halide developing agents possessing the necessary properties thus include certain polyhydroxybenzene developing agents and esters thereof, such as pyrogallol and substituted polyhydroxybenzene developing agents, particularly dihydroxybenzenes substituted with, for example, halogen, alkyl groups of at least 2 and preferably from 2 to 6 carbon atoms and a monocyclic aryl group of the benzene series, e.g. o-chlorohydroquinone, o-bromohydroquinone, 4-phenyl catechol, 4-t-butyl catechol, pyrogallol, 4-n-butylpyrogallol, nordihydroguiauretic acid, 4,5-dibromocatechol, 3,5,6-tribromo-4-phenylcatechol and 1-phenyl-3-(N-n-hexylcarboxamide)-4-[p-(β-hydroquinoylethyl) - phenylazo]-5-pyrazolone. Esters of such developing agents, e.g. formates and acetates of pyrogallol hydrolyze in alkaline solutions can be used in the processes of the invention. In certain cases it has been found to be advantageous to include with the polyhydroxybenzene developing agent such as pyrogallol, an auxiliary developing agent such as monomethyl-p-amino phenol or a 3-pyrazolidone, which latter developing agents by themselves do not yield oleophilic images in the processes described, but which do appear to act synergistically in combination with the polyhydroxybenzenes to yield oleophilic images.

In the accompanying drawings representative sensitive elements of the invention are shown in greatly enlarged cross-sectional view at various stages of the preparation of lithographing printing plates.

In FIG. 1 a negative-positive process is illustrated and in FIG. 2 is shown a positive-positive process contemplated by our invention.

In FIG. 1, layer 10 of the element of Stage 1 represents a support such as paper, film base, etc., layer 11 is a hydrophilic organic colloid layer such as gelatin containing the developing agent and a quantity of black colloidal silver or carbon black, etc., for antihalation protection, layer 12 a gelatino-silver halide emulsion layer for recording the line or halftone image.

In the process of FIG. 1, after exposure to a subject as shown in area 13, followed by alkaline activation and inking, the element appears substantially as shown in Stage 2, area 14 being composed of silver and the reaction product of the oxidized developing agent and the hydrophilic organic colloid present in the silver halide emulson layer produced in the development reaction, carrying the ink image 15, the undeveloped area 16 of layer 12 remaining hydrophilic and repellent of printing ink when moistened with water.

In FIG. 2 is shown a positive-positive system in Stage 1 of which the element includes a support 20 such as a paper or film support, layer 21 an antihalation hydrophilic colloid layer containing developing agent and black colloidal silver, carbon black etc., layer 22 a hydrophilic organic colloid silver halide emulsion layer, and layer 23 a fogged silver halide emulsion layer. Upon image exposure in region 24 followed by alkaline activation and inking, the element appears substantially as shown in Stage 2, the silver halide developing agent of layer 21 which has not been utilized in developing the negative silver image in area 24 of layer 22 having developed a positive silver halide image to silver in areas 25 of layer 23. The ink images 26 are accepted in areas 25 which are composed of silver and the reaction product of the hydrophilic organic colloid present in the silver halide emulsion layer and the oxidized developing agent. The remaining areas 27 are hydrophilic and repel printing ink when the plate is moistened in the lithographic printing press.

In the sensitive elements described the emulsion layers should be substantially hardened, particularly the outermost emulsion layer, e.g. layer 12 of FIG. 1 and layer 23 of FIG. 2, in order to prevent the alkaline activated and inked emulsions from adhering to printing blankets, printing paper, etc. For this purpose the emulsion should be as hard as a gelatin layer containing at least about 2 grams and preferably from about 2 to 15 grams of dry formaldehyde per lb. of gelatin.

In a preferred arrangement of our invention, the developing agent is incorporated in a separate layer under the silver halide emulsion layer since this arrangement gives improved sharpness, latitude and better quality ink images than when the developing agent is incorporated directly in the emulsion layer.

The following examples illustrate representative photographic elements and processes contemplated by our invention.

EXAMPLE 1

Negative-Positive Process

A photographic emulsion was prepared by combining the following ingredients:

I. Fine grain silver chloride emulsion containing 1 mol of Ag per 4350 cc. ----------g-- 43.5
II. Paraffin dispersion prepared as follows:
80 g. molten paraffin dispersed in 400 cc. 10% photographic gelatin solution containing 5 cc. of 10% Alkanol B solution ----------g-- 10.0
III. 4-phenyl catechol dispersion prepared as follows:
50 g. 4-phenyl catechol dissolved in
100 cc. dibutylphthalate at 60–70° C. dispersed in
500 cc. 10% photographic gelatin and
50 cc. 7½% saponin solution and passed through the colloid mill five times ------g-- 10.0
15% saponin solution ----------g-- 1.0
10% formaldehyde solution ----------g-- 1.0
Water ----------cc-- 20.0

The emulsion was coated on the rate of 6.5 grams per square foot on a film base and dried.

The film was exposed to a line negative, then activated for 20 seconds in a 4 percent solution of sodium carbonate monohydrate. Thereafter, the plate was placed in a lithographic printing press, inked in the conventional manner and at least 40 good copies printed. The ink-receptive regions of the plate correspond to the exposed regions 14 of FIG. 1 and the prints obtained therefrom were positives of the subject used for making the original line negative.

EXAMPLE 2

Negative-Positive Process

A dispersion of developing agent was prepared by combining the following ingredients:

I. A 3% gelatin solution containing 12.5 grams of neutral colloidal silver per 454 grams of solution ----------g-- 810
II. Gelatin solution 10% ----------g-- 3300
III. A dispersion prepared as follows:
Solution A—
500 g. 4-phenyl catechol
1000 g. tricresyl phosphate
Solution B—
5000 g. 10% gel solution
50 cc. 7½% saponin
Solution A was added to B at 40° C. with rapid stirring and the mixture milled five times in a colloid mill ----------g-- 1230

The resultant dispersion was coated on a paper support at 1.03 lb. per 100 square feet as layer 11 of the element of FIG. 1, Stage 1. The colloidal silver in the layer serves to improve the definition of the resultant printing plate.

The following emulsion was coated as layer 12 over layer 11 at a rate of 1.36 lb. per 100 square foot.

Fine-grain green sensitized silver chloride emulsion containing 1 mol silver per 3200 cc. --------g-- 3400
10% gelatin solution ----------g-- 470
15% saponin solution ----------cc-- 200
2% formaldehyde solution ----------cc-- 40
Water ----------cc-- 890

The resultant sensitive element was exposed, processed and inked as described in Example 1 to obtain a positive printing plate appearing substantially as shown in FIG. 1, Stage 2. Upon printing as usual in a lithographic printing press, a number of high-quality prints were obtained.

EXAMPLE 3

Positive-Positive Process

A sensitive element having a structure substantially as shown in FIG. 2, Stage 1, was prepared as follows:

LAYER 21

(a) 4-phenyl catechol dispersion [1] ----------g-- 120
(b) 10% aqueous gelatin solution ----------g-- 400
(c) 15% aqueous saponin solution ----------cc-- 50
(d) 2% aqueous formaldehyde solution------cc-- 5
(e) Distilled water ----------cc-- 425

[1] 50 g. 4-phenyl catechol dissolved in
100 g. tricresylphosphate, dispersed in
500 g. 10% aqueous gel solution.
50 cc. 7½% aqueous saponin solution added and milled 5 times in a colloid mill The composition was coated out as layer 21 at 8.5 cc. per square foot on a paper support 20.

LAYER 22

The following emulsion was coated at 15 cc. per square foot on layer 21.

(a) Silver chloride gelatin emulsion (3100 g./mol Ag) ----------g-- 620
(b) 15% aqueous saponin solution --------cc-- 40
(c) 2% aqueous formaldehyde solution ----cc-- 7.2
(d) Water ----------cc-- 832.8

LAYER 23

Layer 23 was coated from the following composition at 7.0 cc. per square foot of coating surface:

(a) Silver chloride gelatin emulsion (3600 g./mol Ag) ----------g-- 360
(b) Water ----------cc-- 200
(c) NaOH 0.25 N aqueous solution ----------cc-- 24
(d) 2% aqueous formaldehyde solution ------cc-- 4.6

The mixture of ingredients (a), (b), (c) and (d) was chemically fogged by holding 40 minutes at 40° C. with stirring. If desired, light or other known methods may be used for fogging the emulsion.

The following ingredients were added to the fogged emulsion above:

| | cc. |
|---|---|
| (e) $H_2SO_4$ 2.0 N aqueous solution | 3.5 |
| (f) 15% aqueous saponin solution | 10.0 |
| (g) 2% aqueous formaldehyde solution | 2.0 |
| (h) Water | 95.9 |

The sensitive element was exposed to a line positive, processed 60 seconds in 4 percent aqueous sodium carbonate monohydrate solution, treated in a 2 percent aqueous acetic acid stop bath for 1 minute, squeegeed to remove excess liquid and run on a lithographic printing press using 0.1 percent phosphoric acid fountain solution. At least 50 copies were obtained, each having little ink on the background and high density images. The inked plate from which the copies were obtained appeared substantially as shown in FIG. 2, Stage 2, of the drawings. In this process the residual developing agent from the negative development step develops an imagewise distribution of silver halide in the fogged layer 23.

EXAMPLE 4

Positive-Positive Process

A sensitive element was prepared and used as described in Example 3 except using the following ingredients.

DEVELOPER DISPERSION

| | G. |
|---|---|
| 4-phenyl catechol | 5 |
| Dibutyl phthalate | 50 |

Dissolve the 4-phenyl catechol in dibutyl phthalate at room temperature, 20–25° C. Disperse the solution in:

| | | |
|---|---|---|
| 10% gel solution | g | 290 |
| 7.5% saponin solution | cc | 25 |
| Water | cc | 180 |

at 40° C., pass through well cooled colloid mill three times and coat as follows:

LAYER 1

Coat the above developer dispersion on a suitable paper base as follows:

| | | |
|---|---|---|
| Developer dispersion | g | 400 |
| Colloidal sliver dispersion of Example 2 | g | 400 |
| 15% [saponion] *saponin* solution | cc | 20 |
| 2% formaldehyde solution | cc | 2.5 |
| Water | cc | 27.5 |

Coat at 40° C. at 11.7 g./sq. ft.

LAYER 2

| | | |
|---|---|---|
| Green sensitized silver chloride emulsion (1 mole) | g | 3300 |
| 15% saponin solution | cc | 200 |
| 2% formaldehyde solution | cc | 40 |
| Water | cc | 2460 |

Coat at 40° C. on Layer 1 at 15.0 cc./sq. ft.

LAYER 3

| | | |
|---|---|---|
| Gelatine silver chloride emulsion (1 mole) | g | 3600 |
| Water | cc | 2000 |
| 0.25/N NaOH | cc | 240 |
| 2% formaldehyde | cc | 46 |

Hold 40 minutes at 40° C. to fog, then add:

| | cc. |
|---|---|
| 2.0 N $H_2SO_4$ | 35 |
| 15% saponin solution | 100 |
| Water | 729 |

EXAMPLE 5

The negative-positive process of producing printing plates described in Example 1 may be carried out by use of a developing solution containing the desired silver halide developing agent rather than having the developing agent contiguous to the emulsion layer as follows:

A gelatino-silver chloride emulsion was coated on a baryta-coated paper support at 1 mol of silver per 800 square feet. Several 4 percent aqueous sodium carbonate monohydrate developing solutions containing different developing agents were used for developing the exposed emulsion layer, followed by treatment with 2 percent acetic acid stop bath for 20 seconds and printing on a lithographic printing press. As a result, the solution containing hydroquinone and toluhydroquinone did not produce acceptable printing plates, whereas these solutions containing o-chlorohydroquinone, 4-phenyl catechol, 4-t-butyl catechol, pyrogallol, 4-n-butylpyrogallol, and nordihydroguiauretic acid gave excellent plates, each printing an appreciable number of copies of good quality.

EXAMPLE 6

Another positive-positive process in which an imagewise distribution of developable silver halide emulsion is developed to produce an oleophilic image at the surface of the emulsion layer, is provided below.

A photographic paper raw stock was coated with contact printing speed gelatino silver chloride emulsion so as to obtain about 47 g. gelatin, 21 g. silver (as silver halide) and 4 g. 4-phenyl catechol per 100 sq. ft. Over this emulsion layer was coated from aqueous solution, a silver chloride emulsion of substantially higher speed than the first emulsion of which the major amount of the colloid vehicle was alkali-soluble acid-insoluble cellulose ether phthalate (only a small amount of gelatin being present) so as to obtain 28 g. of colloid vehicle per 100 sq. ft. and 29 g. of silver per 100 sq. ft.

This photographic element was exposed to record a subject in only the outer emulsion layer after which development was carried out with a conventional elon-hydroquinone developer until a negative silver image was obtained. Thereafter the lower emulsion was flashed to light through the negative image and development initiated with a 4% sodium carbonate monohydrate solution with the result that the 4-phenyl catechol caused tanning development of the silver halide emulsion in the positive region of the lower emulsion. Upon washing the element was copious applications of water the overlying negative emulsion layer was washed off leaving the positive oleophilic image at the surface of the emulsion on the paper support, which image was inked and printed lithographically.

In an alternative method the first emulsion was applied to the paper support as above described, after which a stripping layer of the cellulose ether phthalate (alkali metal salt) was applied from aqueous solution at 8 g. per 100 sq. ft., followed by a high speed gelatino silver halide emulsion also containing 4-phenyl catechol, so as to obtain 47 g. gel, 4 g. 4-phenyl catechol and 21 g. silver per 100 sq. ft. The element was exposed, treated with the carbonate solution to develop the negative image, flashing the lower emulsion through the negative, again activating with carbonate solution and washing to remove the negative emulsion leaving a positive oleophilic image on the paper suport. The carboxylated cellulose derivatives useful in this example such as cellulose ether and cellulose acetate phthalates, are described in more detail in the Yackel et al. U.S. patent application Serial No. 586,705 filed May 23, 1956.

EXAMPLE 7

An oleophilic silver image may be developed in a hydrophilic organic colloid layer as a function of development of a silver halide image in another layer in a diffusion transfer process as follows:

Negative film.—A film support was coated with the following developer layer at 5.6 cc./sq. ft.

| | | |
|---|---|---|
| 4-phenyl catechol dipersion [1] | g | 100 |
| 15% saponin solution | cc | 10 |
| 10% formaldehyde solution | cc | 2 |
| Total | g | 112 |

[1] 4-phenyl catechol dispersion:

| | | | |
|---|---|---|---|
| (A) | 4-phenyl catechol | 12 g. | Dissolved at 70° C. cooled to 25° C. |
| | Tri-cresyl phosphate | 120 g. | |
| (B) | 10% gelatin solution | 456 g. | 35° C. |
| | 5% Alkanol B solution | 50 cc. | |
| | Distilled water | 322 cc. | |
| | | 960 g. total | |

(A) stirred into (B) with rapid stirring and run through a colloid mill three times.

The following silver chloride emulsion was then coated over the developer layer at 9.6 cc. per sq. ft.

| | | |
|---|---|---|
| Gelatin-silver chloride emulsion | g | 142.5 |
| 15% saponin solution | cc | 10.0 |
| 10% formaldehyde solution | cc | 2.5 |
| Water | g | 220.0 |

Reception element.—A paper support was coated at 8.5 cc. per sq. ft. with the following emulsion:

| | | |
|---|---|---|
| Gelatin-silver chloride emulsion | g | 268 |
| 15% saponin solution | cc | 10 |
| 2% formaldehyde solution | cc | 10 |
| Water | cc | 212 |

The emulsion was then fogged by a flood lamp for four seconds at one foot.

The negative film was exposed to a line positive, then both the film and the reception element placed in 8% $Na_2CO_3H_2O$ solution for 15 seconds and at once squeegeed face to face and 40 seconds later stripped apart. The image on the receiver was placed in 4% acetic acid for 20 seconds, squeegeed, then inked and printed on a lithographic press using 0.02% aqueous phosphoric acid fountain solution. A large number of high density prints were obtained.

In the process the developing agent not consumed in developing the negative image has developed an oleophilic positive image in the gelatin reception layer.

EXAMPLE 8

A silver halide diffusion transfer process may be employed wherein the development in a negative emulsion layer controls the imagewise diffusion of a silver halide image as a complex with a silver halide solvent, to a silver precipitating reception layer where the silver complex image is developed to produce the oleophilic image as follows:

The following emulsion was coated on a film support at 9.0 cc. per sq. ft.

| | | |
|---|---|---|
| Gelatino-silver chlorobromide emulsion | g | 375.0 |
| Saponin solution 15% | cc | 25.0 |
| Mucochloric acid solution 2.72% | cc | 8.0 |
| Water | cc | 23.2 |

A silver precipitating layer was coated thereon at 4.5 cc. per sq. ft. from the following:

| | | |
|---|---|---|
| Zinc sulfide dispersion | g | 225.0 |
| Gelatin solution 10% | g | 25.0 |
| Saponin solution 15% | cc | 2.5 |
| Mucochloric acid solution 2.72% | cc | 2.5 |

The film was exposed, then developed for 60 seconds in

| | G. |
|---|---|
| $Na_2CO_3 \cdot H_2O$ | 58 |
| Sodium hydroxide | 12 |
| Hypo | 10 |
| 4-phenyl catechol | 10 |
| Water | 1000 |

Thereafter the film was rinsed in dilute acetic acid, inked and printed using 0.02% phosphoric acid fountain solution. At least 50 good prints were obtained.

In the process it will be apparent that the residual silver halide not initially developed diffused as the complex salt with hypo to the nucleated zinc sulfide layer where it was physically developed to produce the oleophilic image in situ. In a similar manner other silver halide diffusion transfer processes employing the mentioned silver halide developing agents, may be employed for obtaining a transferred silver halide image for development to an oleophilic image in the presence of hydrophilic colloid such as gelatin.

In this process zinc sulfide may be replaced by other silver precipitating agents or physical development nuclei such as mentioned in the above invention of Yackel et al. such as colloidal silver, gold, etc.

EXAMPLE 9

This example illustrates a transfer process in which the developing agent is oxidized imagewise in the presence of hydrophilic organic colloid, as a function (indirect) of development of a silver halide emulsion layer.

The following developer composition is prepared:

| | | |
|---|---|---|
| 4-phenyl catechol dispersion[1] | g | 190 |
| 10% aqueous gelatin solution | g | 124 |
| 15% aqueous saponin solution | ml | 12 |
| 10% aqueous formaldehyde solution | ml | 4 |
| Water | ml | 120 |

[1] As described in Part III of Example 2 in column 5 of the instant application.

The developer composition is coated upon a water resistant paper base at 10.0 g./sq. ft.

An emulsion is prepared containing the following:

| | | |
|---|---|---|
| Silver chloride gelatin emulsion (3600 g./mol silver) | g | 360 |
| 15% aqueous saponin solution | ml | 10 |
| 10% aqueous formaldehyde solution | ml | 2 |
| Water | ml | 60 |

The emulsion is coated over the dried layer of developer at 9.0 g./sq. ft.

The resulting element is exposed by reflex methods to a line positive original. It is then activated by passing it through an 8 percent sodium carbonate monohydrate solution with mechanized rollers in a manner to cause immersion of the exposed sheet and a receiving sheet carrying a dispersion of manganese dioxide in gelatin coated on a cellulose acetate support, for 10 seconds in the alkaline solution and then allowing face to face contact between the exposed sheet and the receiving sheet for 30 seconds before separating them. After separation, the receiving sheet is treated with an aqueous 10 percent phosphoric acid solution and placed on a Multilith press containing regular Multilith ink and a 0.1 percent phosphoric acid fountain solution. About 50 copies of the original were reproduced. The copies were clear in the background areas and inked in the image areas.

As mentioned previously, in this process the developing agent not utilized in the development of the negative silver image, transfers to the receiving sheet and is oxidized there in the present of the organic colloid to form the oleophilic image. As mentioned, in a variation of the process the receiving sheet may be free of oxidizing agent and the developing agent transferred thereto can be oxidized by swabbing with suitable oxidizing agent such as ferric chloride to form the oleophilic image which is inked and printed.

EXAMPLE 10

It is advantageous that a lithographic printing plate have the maximum possible ink-water differentiation between the image areas and the non-image areas. The lithographic plates made according to our invention exhibit an excellent degree of differentiation between the ink-receptive and the water-receptive areas. This differential can be further increased to improve exposure latitude and tolerance to adjustment of ink and water balance on the offset lithographic printing press, by including in the printing surface a material such as ZnO, $Al_2O_3$, carboxy lower alkyl hydroxy ethyl cellulose or polyacrylamide. Acidifying the plate surface after its alkaline image development and stop bath steps may be done with a conventional lithographic desensitizing etch formula such as a 0.05% $H_3PO_4$ solution or the like. The improvement obtained by the addition of zinc oxide or the like was unexpected since it might be predicted that such an addition might adversely effect ink receptivity in the hydrophobic or image areas while increasing only slightly, the water receptive properties in the normally hydrophilic background gelatin surface. The opposite was found to occur and the improvement in the background is obtained with little or no loss of ink receptivity in the image areas.

A sensitive element was prepared in the manner described in Example 3 except adding 100 gms. of finely powdered zinc oxide per mole of silver in the emulsion of layer 23. The coating was exposed to a line positive for four seconds using a 15 watt bulb at a distance of 15 inches. The coating was then processed for 20 seconds in an aqueous 8% solution of trisodiumphosphate at 85° F. Development was stopped by immersing the above coating in a 4% aqueous acetic acid bath for 20 seconds. The coating was then squeezed and run on the [multilith] *Multilith* press utilizing a 1% aqueous phosphoric acid solution as the fountain solution. It was noticed that the above coating yielded printed copies having considerably less "scum" (background density) than a similar element differing only in that it did not contain any zinc oxide. Similar improvements can be obtained by substituting aluminum oxide for the zinc oxide or in general by the use of an insoluble zinc or aluminum compound which will react with phosphoric acid to form zinc or aluminum phosphate in the printing surface of the printing element. The addition of zinc or aluminum compounds to any of the examples of the instant application yields a similar improvement. The preferred amounts of the mentioned compounds to use in the surface emulsion layer of the sensitive elements are as follows: zinc oxide 10 to 60 mg./ft.$^2$, aluminum oxide 3 to 20 mg./ft.$^2$, polyacrylamide 2 to 15 mg./ft.$^2$ or carboxymethylhydroxyethyl cellulose 15 to 120 mg./ft.$^2$.

The components of the sensitive elements of the invention illustrated in the above examples may be varied appreciably and still useful printing plates are obtainable. As will be apparent, the silver handle content of the negative emulsions used is not especially critical and only an amount sufficient to record the image and produce an appreciable amount of oxidized developing agent is required. Useful results are obtained if the emulsions contain at least about 60 mg. silver (as silver halide) per sq. ft. and at least about 100 mg. gelatin per sq. ft. and at least about 30 mg. of the developing agent per sq. ft., in or contiguous to the emulsion layer. In the elements illustrated in FIG. 2 and described in Examples 3 and 4, it may be desirable in some instances to use silver halides of different development induction periods, e.g., the silver halide of layer 23 may have alonger induction period than the silver halide of layer 22.

EXAMPLE 11

The use of a direct positive emulsion in the invention is illustrated in this example.

A sensitive element was prepared in the manner described in Example 2 except replacing the fine-grain, green-sensitized emulsion by a desensitized and partially fogged direct positive emulsion prepared as described in the Kendall and Hill U.S. Patent 2,541,472, granted February 13, 1951.

The resultant element also appearing substantially as shown in FIG. 1, Stage 1, was exposed to a subject with light of wavelength between about 500 to 700 m$\mu$ as described in the above patent and activated with 4% sodium carbonate monohydrate solution to obtain in this case the oleophilic image in areas corresponding to 16 of FIG. 1, Stage 2, whereas the exposed area remain hydrophilic. Upon printing the plate as usual a number of positive lithographic prints were obtained.

Other direct positive emulsions may be used in a similar manner such as solarized emulsions e.g. of the Leermakers U.S. Patent 2,184,013, December 19, 1939. The internal latent image type of direct positive emulsion such as described in the Davey and Knott U.S. Patent 2,592,-250 and Ives U.S. Patent 2,588,982 are also useful. These emulsions contain grains of silver halide having a crystalline structure such that the latent image is formed mostly inside the grain and the emulsion gives appreciably more density with an internal type developer than with an external type developer as described in the above Ives patent. When the internal latent image emulsions are used in the sensitive elements containing developing agent, the alkaline solution used for initiating development advantageously contains a fogging agent such as a hydrazine of the Ives patent to assure development of the direct positive oleophilic image.

A variety of hydrophilic organic colloid vehicles can be used for the silver halide emulsions for recording the subject. Proteins such as gelatin, soy bean protein, casein as well as synthetic organic colloids which are hydrophilic, such as polyvinyl alcohol, hydrolyzed cellulose esters, etc., may be used to the extent that they form the desired oleophilic image with the oxidized developing agent in the development reaction. Various silver salts may be used as the sensitive salt, such as silver bromide, silver iodide, silver chloride, or mixed silver halides such as silver chlorobromide or silver bromoiodide.

Various alkaline materials may be used in the solutions for activation of the exposed sensitive elements, e.g. alkali metal carbonates, caustic alkali, quaternary ammonium hydroxides, amines, etc.

The photographic emulsions for use in our process may be coated on any suitable support including conventional paper supports, paper supports water proofed by coating with cellulose esters or polyethylene. Also, if desired, a cellulose acetate or an aluminum support may be used.

The sensitive elements and processes of the invention are useful for the reproduction of a wide variety of line and halftone subjects. A particular application of the invention is in the preparation of printed positives from microfilm negatives—that is, negatives in which the subject has been recorded on a greatly reduced scale. For this purpose a negative film is prepared by the addition of a quantity of colloidal zinc sulfide to a gelatino-silver halide emulsion, such as a 40/60 chlorobromide emulsion, and coating the emulsion on a film base at about 1 mol of silver halide per 400 square feet and so as to obtain about 0.5 mg. of zinc sulfide per square foot. A negative image is recorded at reduced size on the emulsion which is then developed with a conventional silver halide developing solution containing a small amount of a silver halide solvent such as sodium sulfite. In the areas of minimum exposure, physical development occurs so that a portion of the undeveloped silver halide is dissolved and physically developed onto the colloidal zinc sulfide. In the areas of maximum development, very little or no physical development occurs since the exposed silver halide is reduced to metallic silver before solution of the silver halide takes place. The result is a low density, reversal image in physically developed silver which acts as the mask when the negative is printed onto a positive material. The physically developed silver may have its maximum absorption in the blue region of the spectrum. In this case, in order to obtain maximum masking, it is desirable to print through filters which absorb the ultraviolet and other regions of the spectrum which the physically developed silver does not absorb and to which the positive material is sensitive.

When the microfilm negative prepared as described is used for projection exposure of the sensitive elements illustrated in Examples 1 and 2 above, and positive plates are prepared, lithographic prints are obtained which show good reproduction of the original subject matter.

Photographic emulsions containing developing agents can be used in another [maner] *manner* for making positive working lithographic plates from line or halftone negatives. A sensitive element is provided, as described in Yutzy et al. U.S. Patents 2,596,756 and 2,716,059, comprising an unhardened emulsion containing a tanning silver halide developing agent. The emulsion is exposed and activated with alkaline solution and when development is complete the emulsion is pressed against a hydrophilic surface to transfer the unhardened and undeveloped areas of the emulsion to the surface where it is made hydrophobic by suitable after treatment. The resultant plate is then printed on a lithographic printing press, the ink being repelled by the hydrophilic support surface but is readily accepted by the hydrophobic emulsion area.

What we claim is:

1. A light-sensitive photographic element capable of use as a lithographic printing plate, comprising a support having thereon a gelatin layer containing a sufficient amount of a polyhydroxybenzene silver halide developing agent to develop the exposed silver halide in the light-sensitive layer above it, said agent selected from the class consisting of halogen substituted, phenyl substituted, and 2–6 carbon atoms containing alkyl substituted polyhydroxybenzene developing agents, the oxidation product of which renders gelatin oleophilic, and over said gelatin layer an unfogged gelatino-silver halide emulsion layer uniformly hardened with a hardener such that the gelatin has a hardness equivalent to that of a gelatin layer hardened with about 2 grams to about 15 grams of dry formaldehyde per pound of gelatin.

2. The element of claim 1 in which the developing agent is a halogen subbstituted polyhydroxybenzene silver halide developing agent.

3. The element of claim 1 in which the developing agent is a phenyl substituted polyhydroxybenzene silver halide developing agent.

4. The element of claim 1 in which the developing agent is a 2–6 carbon atom containing alkyl substituted polyhydroxybenzene silver halide developing agent.

5. The element of claim 1 in which the developing agent is a 4-phenyl catechol silver halide developing agent.

6. The element of claim 1 in which the developing agent is an o-chlorohydroquinone silver halide developing agent.

7. A light-sensitive photographic element capable of use as a lithographic printing plate, comprising a support having thereon a gelatin layer containing a sufficient amount of a polyhydroxybenzene silver halide developing agent to develop the exposed silver halide in the light-sensitive layer above it, said agent selected from the class consisting of halogen substituted, phenyl substituted, and 2–6 carbon atoms containing alkyl substituted polyhydroxybenzene developing agents, the oxidation product of which renders gelatin olephilic, over gelatin layer an unfogged gelatino-silver halide emulsion layer and over said emulsion layer a fogged gelatino-silver halide emulsion layer uniformly hardened with a hardener, such that the gelatin has a hardness equivalent to that of a gelatin layer hardened with about 2 grams to about 15 grams of dry formaldehyde per pound of gelatin.

8. The element of claim 7 in which the developing agent is a halogen substituted polyhydroxybenzene silver halide developing agent.

9. The element of claim 7 in which the developing agent is a phenyl substituted polyhydroxybenzene silver halide developing agent.

10. The element of claim 7 in which the developing agent is a 2–6 carbon atoms containing alkyl substituted polyhydroxybenzene silver halide developing agent.

11. The element of claim 7 in which the developing agent is a 4-phenyl catechol silver halide developing agent.

12. The element of claim 7 in which the developing agent is an o-chlorohydroquinone silver halide developing agent.

13. A lithographic printing process which comprises (a) exposing to a subject a photographic element comprising a support having thereon an unfogged gelatino-silver halide emulsion layer uniformly hardened with a hardener, such that the gelatin has a hardness equivalent to that of a gelatin layer hardened with about 2 grams to about 15 grams of dry formaldehyde per pound of gelatin, (b) developing said exposed emulsion layer with an alkaline solution of a polyhydroxybenzene developing agent selected from the class consisting of halogen substituted, phenyl substituted, and 2–6 carbon atoms containing alkyl substituted polyhydroxybenzene developing agents, the oxidation product of which renders gelatin oleophilic, to produce on said emulsion layer a printing surface in which the oxidation product of said developing agent is bound to the gelatin in the developed areas of the layer and has an oleophilic residue receptive of greasy printing ink, and (c) inking the developed areas with greasy printing ink and printing therefrom in a lithographic printing press.

14. The process of claim 13 in which the developing agent is a halogen substituted polyhydroxybenzene silver halide developing agent.

15. The process of claim 13 in which the developing agent is a phenyl substituted polyhydroxybenzene silver halide developing agent.

16. The process of claim 13 in which the developing agent is a 2–6 carbon atoms containing alkyl substituted polyhydroxybenzene silver halide developing agent.

17. The process of claim 13 in which the developing agent is a 4-phenyl catechol silver halide developing agent.

18. The process of claim 13 in which the developing agent is an o-chlorohydroquinone silver halide developing agent.

19. A lithographic printing process which comprises (a) exposing to a subject a photographic element comprising a support having thereon a gelatin layer containing a sufficient amount of a polyhydroxybenzene silver halide developing agent to develop the exposed silver halide in the light-sensitive layer above it, said agent selected from the class consisting of halogen substituted, phenyl substituted, and 2–6 carbon atoms containing alkyl substituted polyhydroxybenzene developing agents, the oxidation product of which renders gelatin oleophilic and over said gelatin layer an unfogged gelatino-silver halide emulsion layer uniformly hardened with a hardener, such that the gelatin has a hardness equivalent to that of a gelatin layer hardened with about 2 grams to about 15 grams of dry formaldehyde per pound of gelatin, and (b) developing said exposed emulsion layer with an alkaline solution to produce on said emulsion layer a printing surface in which the oxidation product of said developing agent is bound to the gelatin in the developed areas of the layer and has an oleophilic residue receptive of greasy printing ink.

20. The process of claim 19 in which the developing agent is a halogen substituted polyhydroxybenzene silver halide developing agent.

21. The process of claim 19 in which the developing agent is a phenyl substituted polyhydroxybenzene silver halide developing agent.

22. The process of claim 19 in which the developing agent is a 2–6 carbon atoms containing alkyl substituted polyhydroxybenzene silver halide developing agent.

23. The process of claim 19 in which the developing agent is a 4-phenyl catechol silver halide developing agent.

24. The process of claim 19 in which the developing agent is an o-chlorohydroquinone silver halide developing agent.

25. A lithographic printing process which comprises (a) exposing to a subject a photographic element comprising a support having thereon a gelatin layer containing a sufficient amount of a polyhydroxybenzene silver halide developing agent to develop the exposed silver halide in the light-sensitive layer above it, said agent selected from the class consisting of halogen substituted, phenyl substituted, and 2–6 carbon atoms containing alkyl substituted polyhydroxybenzene developing agents, the oxidation product of which renders gelatin olephilic, over said gelatin layer an unfogged gelatino-silver halide emulsion layer and over said emulsion layer a fogged gelatino-silver halide emulsion layer uniformly hardened with a hardener, such that the gelatin has a hardness equivalent to that of a gelatin layer hardened with about 2 grams to about 15 grams of dry formaldehyde per pound of gelatin, and (b) developing said exposed emulsion layer containing said developing agent with an alkaline solution to produce on said fogged emulsion layer a printing surface which is positive with respect to the original subject and in which the oxidation product of said developing agent is bound to the gelatin of the fogged emulsion layer in the areas corresponding to unexposed areas of the layer and has an oleophilic residue receptive of greasy printing ink.

26. The process of claim 25 in which the developing agent is a halogen substituted polyhydroxybenzene silver halide developing agent.

27. The process of claim 25 in which the developing agent is a phenyl substituted polyhydroxybenzene silver halide developing agent.

28. The process of claim 25 in which the developing agent is a 2–6 carbon atoms containing alkyl substituted polyhydroxybenzene silver halide developing agent.

29. The process of claim 25 in which the developing agent is a 4-phenyl catechol silver halide developing agent.

30. The process of claim 25 in which the developing agent is an o-chlorohydroquinone silver halide developing agent.

*31. A lithographic printing process which comprises:*

*(a) developing an exposed light sensitive photographic element comprising a support having thereon a gelatin-silver halide emulsion layer with a sufficient amount of a polyhydroxybenzene silver halide developing agent to develop the exposed silver halide in the light sensitive layer, said agent selected from the class consisting of halogen substituted, phenyl substituted and 2–6 carbon atoms containing alkyl substituted polyhydroxybenzene developing agents, the oxidation product of which renders gelatin oleophilic to produce on said emulsion layer an image,*

*(b) transferring the unused developing agent imagewise by diffusion to a fogged gelatin-silver halide emulsion layer having a hardness equivalent to that of a gelatin layer hardened with about 2 grams to about 15 grams of dry formaldehyde per pound of gelatin, and*

*(c) allowing the transferred developing agent to develop the fogged silver halide imagewise and thereby form an oleophilic image receptive of greasy printing ink.*

*32. The process of claim 31 in which the developing agent is a halogen substituted polyhydroxybenzene silver halide developing agent.*

*33. The process of claim 31 in which the developing agent is a phenyl substituted polyhydroxybenzene sliver halide devolping agent.*

*34. The process of claim 31 in which the developing agent is a 2–6 carbon atoms containing alkyl substituted polyhydroxybenzene sliver halide developing agent.*

*35. The process of claim 31 in which the developing agent is a 4-phenyl catechol silver halide developing agent.*

*36. The process of claim 31 in which the developing agent is an o-chlorohydroquinone silver halide developing agent.*

*37. A lithographic printing process which comprises:*

*(a) developing an exposed light sensitive photographic element comprising a support having thereon a gelatin-silver halide emulsion layer with a sufficient amount of a polyhydoxybenzene silver halide developing agent to develop the exposed silver halide in the light sensitive layer, said agent selected from the class consisting of halogen substituted, phenyl substituted and 2–6 carbon atoms containing alkyl substituted polyhydroxybenzene developing agents, the oxidation product of which renders gelatin oleophilic to produce on said emulsion layer an image,*

*(b) transferring the unused developing agent imagewise by diffusion to a separate element having a supported, fogged gelatin-silver halide emulsion layer having a hardness equivalent to that of a gelatin layer hardened with about 2 grams to about 15 grams of dry formaldehyde per pound of gelatin, and*

*(c) allowing the transferred developing agent to develop the fogged silver halide imagewise and thereby form an oleophilic image receptive of greasy printing ink.*

*38. A lithographic printing process which comprises:*

*(a) developing an exposed light sensitive photographic element comprising a support having thereon a gelatin layer containing a sufficient amount of a polyhydroxybenzene silver halide developing agent to develop the exposed silver halide in the light sensitive layer above it, said agent selected from the class consisting of halogen substituted, phenyl substituted and 2–6 carbon atoms containing alkyl substituted polyhydroxybenzene developing agents, the oxidation product of which renders gelatin oleophilic, and over said gelatin layer an unfogged gelatino silver halide emulsion layer with an alkaline solution to produce on said emulsion layer an image,*

*(b) transferring the unused developing agent imagewise by diffusion to a separate element having a supported, fogged gelatin-silver halide emulsion layer having a hardness equivalent to that of a gelatin layer hardened with about 2 grams to about 15 grams of dry formaldehyde per pound of gelatin, and*

*(c) allowing the transferred developing agent to develop the fogged silver halide imagewise and thereby form an oleophilic image receptive of greasy printing ink.*

References Cited by the Examiner

The following references, cited by the Examiner, are of record in the patented file of this patent or the original patent.

UNITED STATES PATENTS

| | | | |
|---|---|---|---|
| 1,742,710 | 1/30 | Krebs | 96—29 |
| 1,961,927 | 6/34 | Gerking | 96—33 |
| 2,372,873 | 4/45 | Zappert | 96—11 |
| 2,444,205 | 6/48 | Mullen | 96—33 |
| 2,565,376 | 8/51 | Land | 96—29 |
| 2,592,368 | 4/52 | Yackel | 96—95 |
| 2,593,912 | 4/52 | Orinick | 96—87 |
| 2,661,293 | 12/53 | Land | 96—29 |
| 2,685,510 | 8/54 | Yackel | 96—68 |
| 2,704,712 | 3/55 | Jackson | 96—35 |
| 2,725,298 | 11/55 | Yutzy et al. | 96—28 |
| 2,937,945 | 5/60 | Weyde et al. | 96—29 |
| 2,996,382 | 8/61 | Luckey et al. | 96—68 |
| 3,038,804 | 6/62 | Knox et al. | 96—94 |
| 3,039,869 | 6/62 | Rogers et al. | 96—3 |

OTHER REFERENCES

Lange: Handbook of Chemistry, 7th edition, Handbook Pub. Inc., Sandusky, Ohio, 1949, page 1,786.

Mees: The Theory of the Photographic Process (revised edition), MacMillan Co., New York (1954), pages 580–82.

The British Journal of Photography, June 5, 1914, page 446.

NORMAN G. TORCHIN, *Primary Examiner.*